(12) United States Patent
Jdira et al.

(10) Patent No.: US 9,153,466 B2
(45) Date of Patent: Oct. 6, 2015

(54) WAFER BOAT

(71) Applicant: ASM IP Holding B.V., Almere (NL)

(72) Inventors: Lucian C. Jdira, Almere (NL); Arjen Klaver, Almere (NL); Klaas P. Boonstra, Almere (NL); Chris G. M. De Ridder, Almere (NL); Theodorus G. M. Oosterlaken, Almere (NL)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 13/871,279

(22) Filed: Apr. 26, 2013

(65) Prior Publication Data

US 2013/0284683 A1    Oct. 31, 2013

Related U.S. Application Data

(60) Provisional application No. 61/638,613, filed on Apr. 26, 2012.

(51) Int. Cl.
    *H01L 21/673* (2006.01)

(52) U.S. Cl.
    CPC .... *H01L 21/67309* (2013.01); *H01L 21/67303* (2013.01)

(58) Field of Classification Search
    CPC .................. H01L 21/67303; H01L 21/67306; H01L 21/67309
    USPC ........ 211/41.1, 41.12, 41.17, 41.18; 432/258, 432/259; 206/710, 711
    See application file for complete search history.

(56) References Cited

U.S. PATENT DOCUMENTS

| | | | | |
|---|---|---|---|---|
| 3,169,295 A | * | 2/1965 | Paspy | 432/259 |
| RE26,345 E | * | 2/1968 | Cummings | 264/601 |
| 5,169,684 A | * | 12/1992 | Takagi | 427/248.1 |
| 5,534,074 A | * | 7/1996 | Koons | 118/728 |
| 5,584,401 A | * | 12/1996 | Yoshida | 211/41.1 |
| 5,858,103 A | * | 1/1999 | Nakajima et al. | 118/728 |
| 5,865,321 A | * | 2/1999 | Tomanovich | 211/40 |
| 5,882,418 A | * | 3/1999 | Fujii et al. | 118/728 |
| 5,921,773 A | * | 7/1999 | Lee | 432/258 |
| 5,931,666 A | * | 8/1999 | Hengst | 432/258 |
| 6,033,215 A | * | 3/2000 | Ohsawa | 432/258 |
| 6,099,302 A | * | 8/2000 | Hong et al. | 432/259 |
| 6,110,285 A | * | 8/2000 | Kitazawa et al. | 118/715 |

(Continued)

FOREIGN PATENT DOCUMENTS

| JP | 2000232151 A | 8/2000 | |
|---|---|---|---|
| WO | WO 2004112113 A1 * | 12/2004 | H01L 21/22 |

*Primary Examiner* — Stanton L Krycinski
(74) *Attorney, Agent, or Firm* — Banner & Witcoff, Ltd.

(57) ABSTRACT

A wafer boat for accommodating semiconductor wafers comprises two side rods and at least one back rod, the rods being vertically oriented and extending between a top member and a bottom member. The rods comprise vertically spaced recesses formed at corresponding heights, recesses at the same height defining a wafer accommodation for receiving and supporting a wafer in a substantially horizontal orientation, the recesses having an improved shape. The upwardly facing surfaces of the recesses comprise a first flat surface in an inward region of the recess which is horizontal or inclined upward in an outward direction of the recess and a second flat surface in an outer region of the recess which is inclined downward in an outward direction of the recess. The intersection of the first and second surface forming an edge for supporting the wafer. The recesses are easy to machine and prevent damage to the wafer.

7 Claims, 7 Drawing Sheets

(56) References Cited

U.S. PATENT DOCUMENTS

| | | | |
|---|---|---|---|
| 6,206,197 B1 * | 3/2001 | Decamps et al. | 206/711 |
| 6,361,313 B1 * | 3/2002 | Beyaert et al. | 432/259 |
| 6,617,225 B2 * | 9/2003 | Boyle et al. | 438/455 |
| 6,979,659 B2 * | 12/2005 | Zehavi et al. | 438/795 |
| 7,077,913 B2 * | 7/2006 | Shimada | 118/725 |
| 7,241,141 B2 * | 7/2007 | Wedel | 432/258 |
| 7,431,158 B2 * | 10/2008 | Yamada et al. | 206/454 |
| 7,661,544 B2 * | 2/2010 | Herzog | 211/41.18 |
| 7,748,542 B2 * | 7/2010 | Yudovsky et al. | 211/41.18 |
| 8,067,820 B2 * | 11/2011 | Kihara | 257/627 |
| 8,307,997 B2 * | 11/2012 | Jonas et al. | 211/41.18 |
| 2002/0130061 A1 * | 9/2002 | Hengst | 206/710 |
| 2003/0157453 A1 * | 8/2003 | Irie et al. | 432/239 |
| 2005/0023231 A1 * | 2/2005 | Huang et al. | 211/41.18 |
| 2006/0226094 A1 * | 10/2006 | Cho et al. | 211/41.18 |
| 2007/0006803 A1 * | 1/2007 | Cadwell et al. | 117/200 |
| 2007/0082314 A1 * | 4/2007 | Wedel | 432/258 |

* cited by examiner ness of the wafer and the boat, for instance, the wafer may move relative to the
WAFER BOAT

CROSS-REFERENCE TO RELATED APPLICATIONS

This application claims priority under 35 U.S.C. §119(e) to U.S. Provisional Application Ser. No. 61/638,613, filed Apr. 26, 2012, which is hereby incorporated by reference in its entirety.

FIELD OF THE INVENTION

This invention relates to a design for a wafer boat for accommodating a vertically spaced stack of semiconductor wafers during processing in a vertical furnace.

BACKGROUND

In vertical furnaces used for semiconductor wafer processing, a wafer boat may be used for accommodating a stack of vertically spaced apart wafers. Typically, as shown in FIG. 1, a wafer boat 100 comprises three or more vertical rods 110 which extend between a top member 120 and a bottom member 130. In the example of FIG. 1, three rods 110 are shown: two side rods 110A and one back rod 110B. In the rods, vertically spaced apart recesses 150 are formed at corresponding heights, facing inwardly (i.e. generally towards a central axis of the wafer boat 100). Each recess serves as a support arranged for engaging a circumferential side portion of a wafer, and recesses at a same height define a wafer accommodation for receiving and supporting a wafer in a substantially horizontal orientation. Wafers can be inserted into and removed from the boat at an open side of the boat, opposite the back rod 110B.

A problem with known wafer boats is that damage may occur on the wafer at the point of contact between the wafer and the boat. Due to different thermal expansion of the wafer and the boat, for instance, the wafer may move relative to the recess, resulting in scratches.

In the art, support members are proposed that have a convex support surface to minimize contact stresses in the wafer at the support point. However, boats having these support members are difficult to manufacture and require elaborate machining. In some proposals the wafer support members are separately machined for ease of machining and then mounted in the wafer boat which is also a complex procedure and construction.

SUMMARY OF THE INVENTION

It is an object of the present invention to provide a wafer boat that minimizes contact stress in supported wafers and is easier to manufacture than known wafer boats.

To this end, a first aspect of the present invention is directed to a wafer boat comprising two side rods and at least one back rod. In a use orientation of the wafer boat, the rods may be substantially vertically oriented, and extend between a top member and a bottom member. The rods may comprise vertically spaced apart recesses formed at corresponding heights, wherein recesses at a same height may face generally inwards and towards each other to define a wafer accommodation for receiving and supporting a wafer in a substantially horizontal orientation. Each recess may include a lower, upwardly facing surface comprising a first flat surface (portion) and a second flat surface (portion). The first flat surface (portion) may be disposed in an outward region of a respective recess, and extend horizontally or be inclined downward in an outward direction. The second flat surface (portion) may be disposed in an inner region of the recess, and be inclined downward in an inward direction. An intersection of or join between the first and second surfaces may form an edge or ridge for supporting a wafer.

The first and second flat surfaces or surface portions may thus include an angle. The included angle may typically be an obtuse angle, i.e. an angle in the range of 90-180 degrees. In one embodiment, for instance, the respective angles of inclination of the first and second surfaces/surface portions of a lower surface of a recess may be in a range of 1 to 10 degrees with respect to a horizontal plane; accordingly, the angle included by the respective first and second surfaces may be in the range of (180−(2*10)=)160 to (180−(2*1)=)178 degrees. In a preferred embodiment, the respective angles of inclination of the first and second surfaces/surface portions of a lower surface of a recess may be in a range of 2 to 6 degrees with respect to a horizontal plane; accordingly, the angle included by the respective first and second surfaces may be in the range of (180−(2*6)=)168 to (180−(2*2)=)176 degrees. In a more preferred embodiment, the respective angles of inclination of the first and second surfaces may be about 3 degrees, such that the angle included by the respective first and second surfaces is about (180−(2*3)=)174 degrees, e.g. 174±1 degrees.

An edge defined by the first and second surfaces/surface portions of a lower surface of a respective recess may preferably extend in a generally horizontal plane, and/or be rounded off to a radius of curvature of at least 1 mm, and more preferably to a radius of curvature of at least 3 mm.

These and other features and advantages of the invention will be more fully understood from the following detailed description of certain embodiments of the invention, taken together with the accompanying drawings, which are meant to illustrate and not to limit the invention.

DETAILED DESCRIPTION OF THE INVENTION

Figure 1:
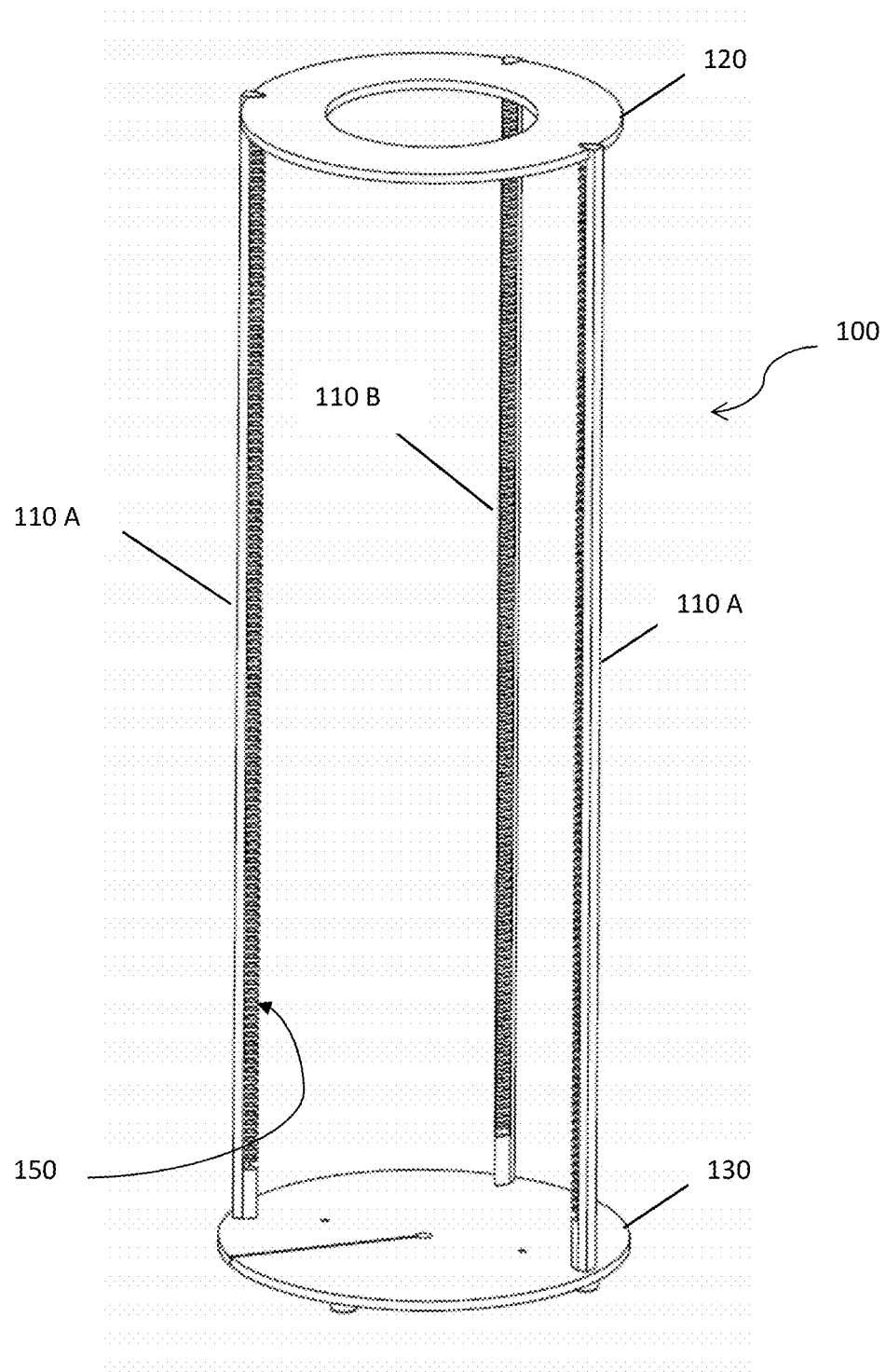
FIG. 1 schematically shows, in a perspective view, an exemplary embodiment of a wafer boat according to the present invention in its entirety.

The invention will be further explained with reference to the figures. In the figures, similar parts will be referred to with like reference numerals.

Figure 2:
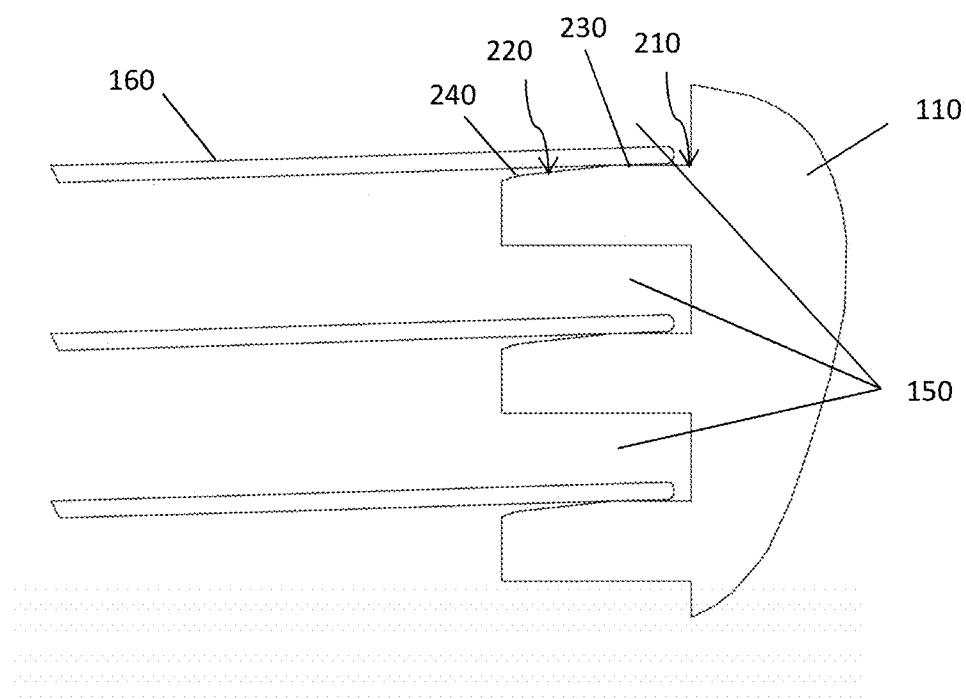
FIGS. 2 and 3 show schematically the shape of recesses in two exemplary embodiments of the invention.
Figure 3:
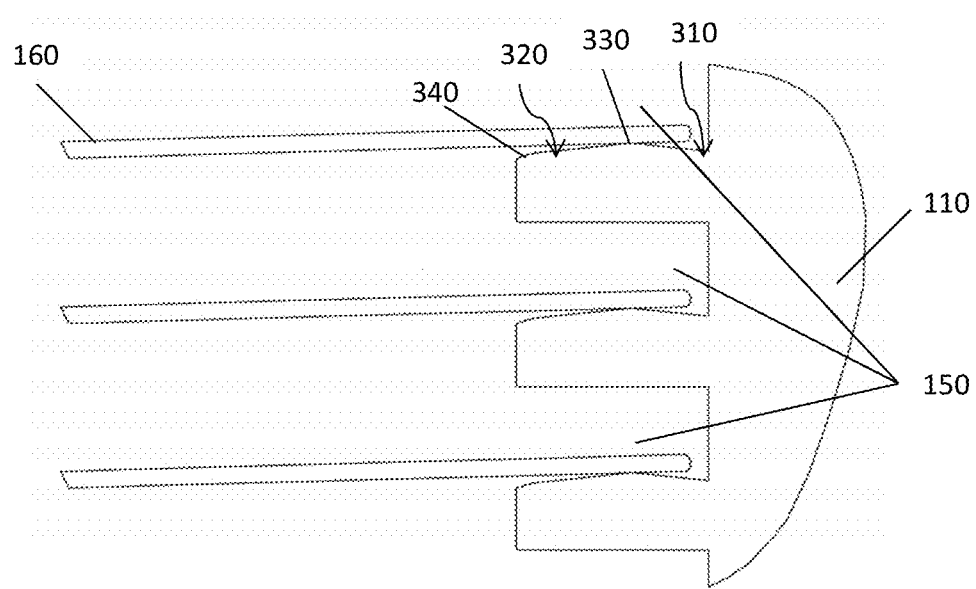

FIGS. 2 and 3 schematically illustrate the shape of recesses 150 in two alternative, exemplary embodiments of the invention; for clarity, each of the recesses 150 is shown to support a wafer 160 at a position along the wafer's outer circumferential edge. In each embodiment, a lower, upwardly facing surface of a recess 150 comprises two adjacent, flat or substantially flat surfaces/surface portions 210, 220 that are inclined relative to each other. That is, the two surfaces 210, 220 may include an angle smaller than 180°, while the outward normals of the surfaces 210, 220 may diverge from one another. In the context of a wafer boat 100 as shown in FIG. 1, the recesses 150 may face generally inward, towards a central axis of the wafer boat 100. Accordingly, a first 210 of the two surfaces 210, 220 may be associated with an inner region of a respective recess 150, while a second 220 of the two surfaces 210, 220 may be associated with an outer region of the respective recess 150.

In the embodiment of FIG. 2, the first flat/planar surface 210 in the outer region of a recess 150 is horizontal, while the second flat/planar surface 220 in an inner region of the recess is inclined downward in the inward direction. The intersection of the first and second surfaces 210, 220 forms an edge 230. Preferably, edge 230 is rounded off to a radius of curvature of 1 mm or greater and more preferably to a radius of curvature of 3 mm or greater to avoid contact stress in the wafer by a sharp edge.

When a wafer 160 is supported on a lower, upward facing surface 210, 220 of a recess 150 including an edge 230, a central portion of the wafer 160 sags under its own weight and the wafer 160 shows a radius of curvature, with the wafer edge bending upwards. As a result, the wafer 160 is supported on the edge 230 of the lower, upward facing surface 210, 220 of the recess 150, and the outer region of the wafer 160, extending beyond edge 230, is not contacting surface 210. Also the free hanging part of the wafer 160 at the open end of the wafer boat sags significantly. Preferably, the boat 100 is dimensioned such the support edge 230 supports the wafer 160 at a position not more than 2 mm away from the outer, circumferential edge of the wafer 160. Preferably the inner edge 240 of the recess 150 is also rounded off.

In the embodiment of FIG. 3, the first flat surface 310 in the outer region of the recess 150 is inclined downward in the outward direction, while the second flat surface 320 in the inner region of the recess 150 is inclined downward in the inward direction. The intersection of the surfaces 310, 320 forms an edge 330. Preferably, edge 330 is rounded off to a radius of curvature of 1 mm or greater and more preferably to a radius of curvature of 3 mm or greater to avoid contact stress in the wafer by a sharp edge. The inclination of the first surface 310 ensures that the outer region of the wafer 160, extending beyond edge 330, is not contacting surface 310, also in case of e.g. small variations in the dimensioning of the boat 100 or the wafer being slightly warped. Preferably, the boat 100 is dimensioned such that the support edge 330 supports the wafer 160 at a position not more than 2 mm away from the edge of the wafer. Preferably the inner edge 340 of the recess is also rounded off.

Figure 4:
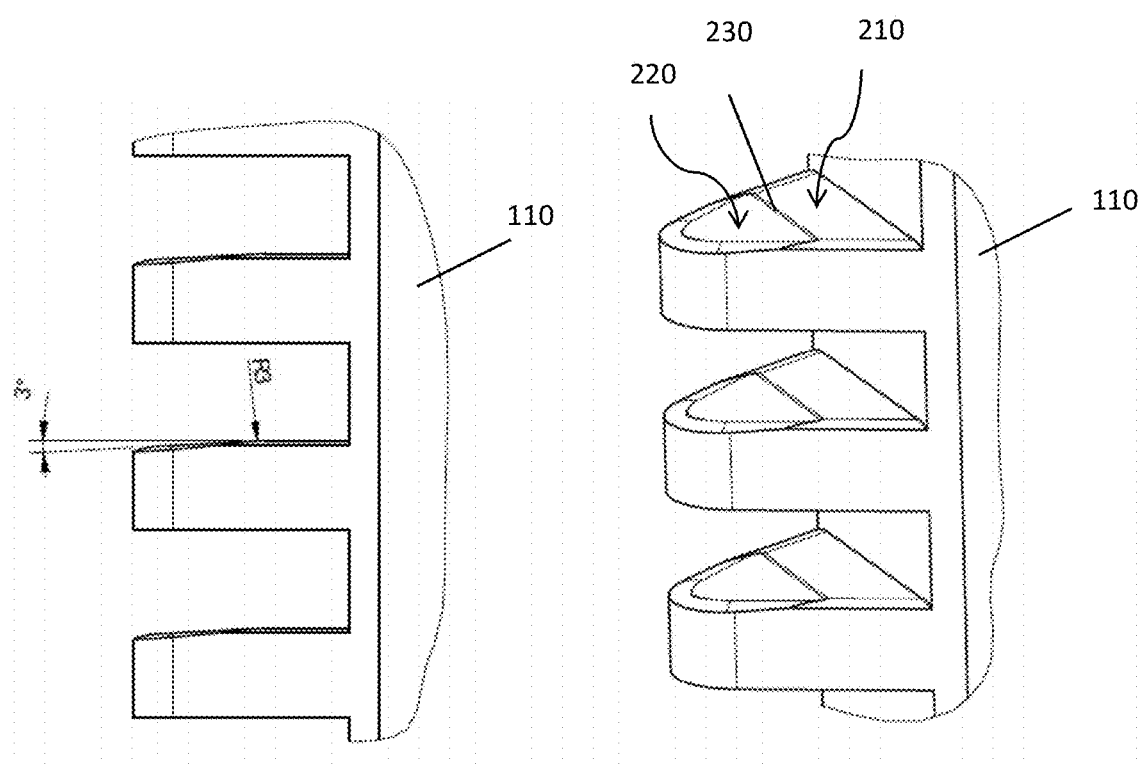
FIGS. 4 and 5 schematically show in more detail the shape of recesses in two exemplary embodiments of the invention in a side view and in a perspective view.
Figure 5:
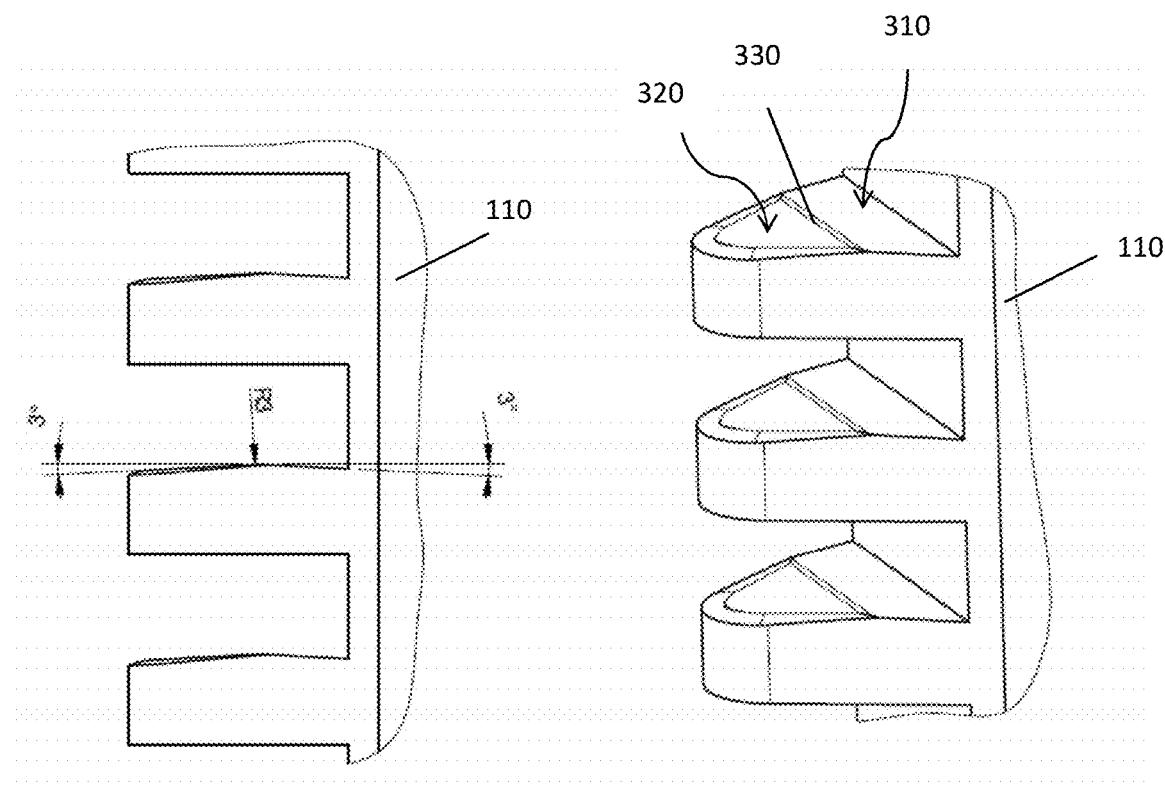

FIG. 4 shows the recesses of FIG. 2 in more detail. And FIG. 5 shows the recesses of FIG. 3 in more detail. An angle of inclination relative to a horizontal plane of first surfaces 210, 310 is in a range of 0 to 10 degrees, more preferably in a range of 0 to 6 degrees and most preferable about 3 degrees. If inclined, the first surface 210, 310 is inclined downward in the outward direction. An angle of inclination relative to a horizontal plane of second surface 220, 320 is in a range of 1 to 10 degrees, more preferably in a range of 2 to 6 degrees and most preferable about 3 degrees and the inclination is downward in the inward direction. Edge 230, 330 is in about tangential direction of a wafer 160 supported in the boat 100 and are preferably horizontal. In FIGS. 4 and 5 the angle of inclination relative to the horizontal plane for surfaces 220, 310 and 320 is 3 degrees and edge 230, 330 is rounded off to a radius of curvature of 3 mm.

Figure 6:
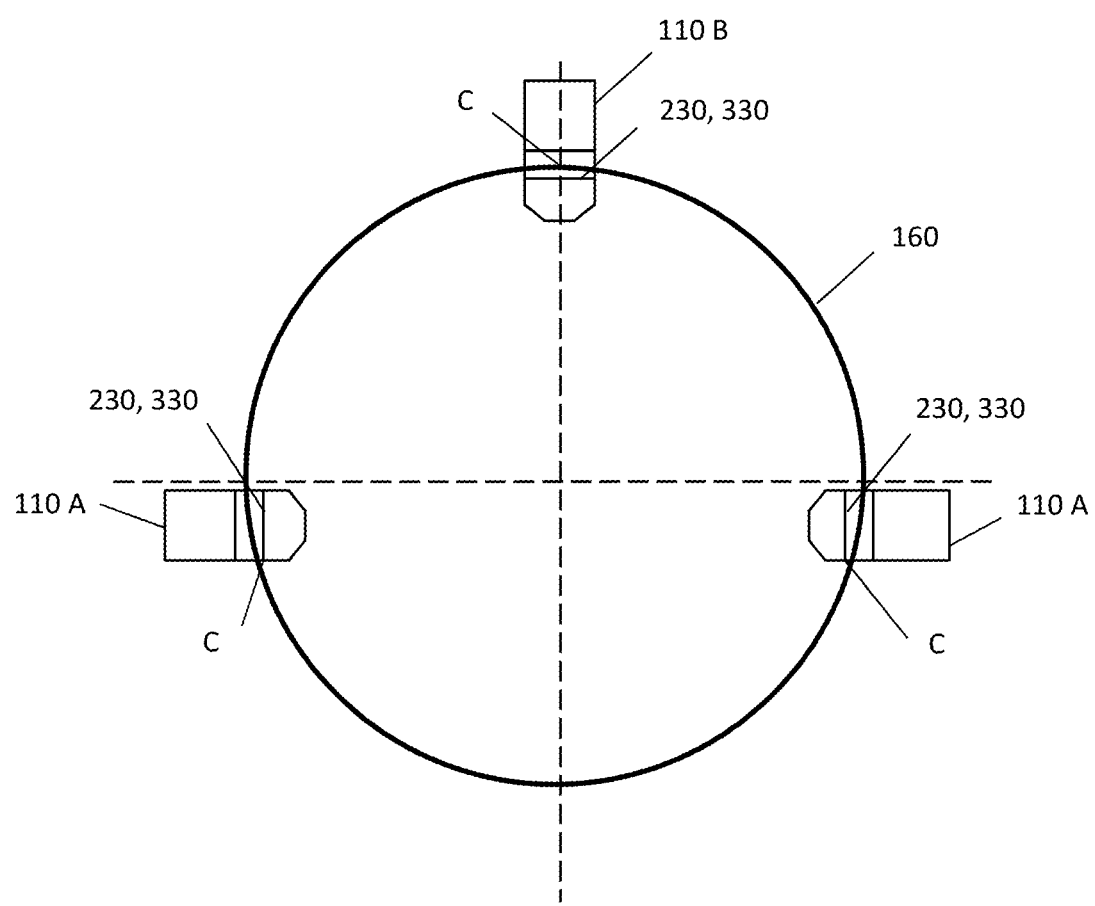
FIGS. 6 and 7 schematically shows orientations of the rods in two embodiments of the invention in a top view.
Figure 7:
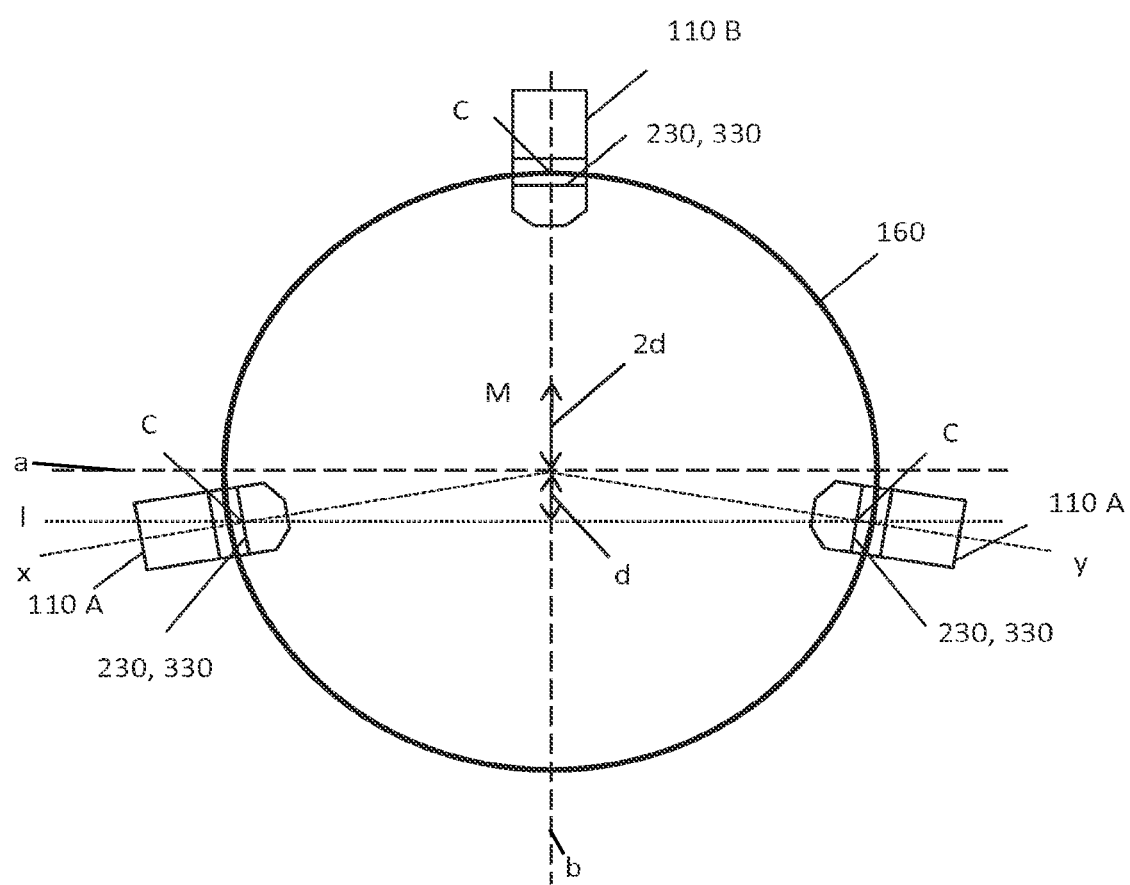

FIGS. 6 and 7 shows orientations of the rods 110 in two embodiments of the invention in a top view.

FIG. 6 shows an orientation that is commonly used for wafer boats 100: the recesses in side rods 110A are generally facing inwards and towards each other. At a side of each side rod 110A that is nearest to the centerline of the wafer 160 (the imaginary, interrupted line that extends through the center of the wafer 160 and runs from left to right in the Figure), edge 230, 330 extends approximately tangentially to a circumferential edge of a wafer 160, but at the opposing side of the side rod 110A a significant deviation from the tangential direction occurs. A disadvantage of this orientation in combination with the sagging of the wafer 160 towards the center and towards the open end of the boat 100 is that the point of contact of the wafer 160 in the recesses 150 of the side rods 110A will be at positions C, at the side of the rods 110A, at an end of edges 230, 330. This might not be beneficial for contact stresses in the wafer 160. Further, when the boat is used in CVD processes, the point of contact at the side of the rods 110A might be susceptible to sticking to the wafer due to film deposition and particle formation during unloading of the wafer after deposition. In back rod 110B, the point of contact C will be in the center of the recess 150, in the center region of the edge 230, 330.

In FIG. 7 the orientation of the side rods 110A has been adapted to mitigate the above-mentioned issues. The adapted orientation of the side rods 110A may be best described in terms of several geometric lines that relate the orientation of the rods 110A, 110B of the wafer boat 100 to a respective wafer accommodation defined by recesses 150 provided therein at a corresponding height. A first geometric line introduced to this end is a (diametrical) side-to-side centerline a that extends through a centerpoint M of the wafer accommodation from one side to another. Another geometric line is a (diametrical) back-to-front centerline b that extends through the centerpoint M of the wafer accommodation from the back to the front, and that is perpendicular to the side-to-side centerline a. A further connection line l may connect the centers of edges 230, 330 of opposite side recesses 150 (in side rods 110A) defining the wafer accommodation, while respective direction lines x and y may extend through the respective centers of (the recesses 150 in) side rods 110A in a direction substantially perpendicular to the respective recesses 150, and more in particular to the edges 230, 330 provided therein.

The side rods 110A may now be positioned to the front of side-to-side centerline a, while the recesses 150 in the side rods 110A still approximately face the center M of a wafer accommodation. Connection line l may extend parallel to side-to-side center line a. Direction lines x and y may be non-parallel (preferably including an obtuse angle), and intersect back-to-front centerline b in the center of the wafer accommodation M. However, the optimum crossing point/ point of intersection of direction lines x and y with back-to-front centerline b may be spaced from center point M, and be located between a point at a distance d in the forward direction from center point M and a point at a distance 2d in backward direction from center point M to achieve that the point of contact C in the recesses of the side rods 110A will be approximately in the center of the recess, in the center of edges 230, 330. Here, d may equal 7% of a diameter of the wafer accommodation, e.g. the diameter of the inscribed circle of the recesses 150 defining the wafer accommodation. For a wafer accommodation configured to hold a 300 mm wafer, d may thus amount to 21 mm.

It is an advantage of the present invention that main upwardly facing surfaces of the recesses are flat surfaces that are relatively simple to machine. As discussed before the edge 230,330 and the edge 240, 340 are preferably rounded off but that is relatively easy to achieve.

The boat of the present invention can be made of quartz or silicon carbide or silicon or any other temperature resistant ceramic material that does not contaminate the wafers. If the boat is provided with a silicon carbide coating, deposited by Chemical Vapor Deposition, preferably a polishing treatment is applied after deposition of the coating to remove eventual protrusion grown during the coating process.

LIST OF REFERENCE NUMERALS

100 wafer boat
110 rod
120 top member
130 bottom member
150 recess
160 wafer
210, 310 first, outer flat surface
220, 320 second, inner flat surface
230, 330 edge formed at intersection of first and second flat surfaces
240, 340 inner edge of recess
C contact position
M wafer center/geometric center of wafer accommodation

What is claimed is:

1. A wafer boat comprising two side rods and at least one back rod, the rods extending substantially vertically between a top member and a bottom member, the rods comprising vertically spaced apart recesses formed at corresponding heights, recesses at a same height facing generally inwards and towards each other thereby defining a wafer accommodation for receiving and supporting a wafer in a substantially horizontal orientation, wherein each recess includes a lower, upwardly facing surface comprising a first flat surface in an outward region of the recess which is inclined downward in an outward direction and a second flat surface in an inner region of the recess which is inclined downward in an inward direction, an intersection of the first and second surfaces forming a respective support edge for supporting the wafer, wherein the support edges are substantially horizontal and straight, and wherein the support edges are configured to contact the wafer less than 2 mm away from the wafer edge and wherein each second flat surface in the inner region of the recess is bounded at an inner side thereof by an inner edge that is rounded off.

2. The wafer boat of claim 1, wherein an angle of inclination of each of the first and second surfaces is in a range of 1 to 10 degrees with respect to a horizontal plane.

3. The wafer boat of claim 2, wherein the respective angles of inclination of the first and second surfaces are in a range of 2 to 6 degrees.

4. The wafer boat of claim 2, wherein the respective angles of inclination of the first and second surfaces are about 3 degrees.

5. The wafer boat of claim 1, wherein the supporting edges for supporting the wafer are rounded off to a radius of curvature of at least 1 mm.

6. The wafer boat of claim 5, wherein the supporting edges for supporting the wafer are rounded off to a radius of curvature of at least 3 mm.

7. The wafer boat of claim 1, wherein, for each wafer accommodation, respective direction lines extend through respective centers of the recesses in the side rods in a direction substantially perpendicular to the supporting edges provided therein, and wherein the side rods are positioned to the front of a side-to-side centerline, and the side rods are oriented such that said direction lines intersect one another on a back-to-front centerline of the wafer accommodation between a point at a distance d in the forward direction from a center point of the wafer accommodation and a point at a distance 2d in the backward direction from said center point, with d being equal to 7% of a diameter of said wafer accommodation.

* * * * *